United States Patent
Pfeiffer et al.

(10) Patent No.: US 9,088,278 B2
(45) Date of Patent: Jul. 21, 2015

(54) PHYSICAL UNCLONABLE FUNCTION GENERATION AND MANAGEMENT

(71) Applicant: INTERNATIONAL BUSINESS MACHINES CORPORATION, Armonk, NY (US)

(72) Inventors: Dirk Pfeiffer, Croton-on-Hudson, NY (US); Jean-Olivier Plouchart, New York, NY (US); Peilin Song, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 13/886,805

(22) Filed: May 3, 2013

(65) Prior Publication Data

US 2014/0327468 A1   Nov. 6, 2014

(51) Int. Cl.
  *H04L 9/20* (2006.01)
  *H03K 19/003* (2006.01)

(52) U.S. Cl.
  CPC .................................. *H03K 19/003* (2013.01)

(58) Field of Classification Search
  USPC ...................... 326/8, 82, 83; 380/46; 713/189
  See application file for complete search history.

(56) References Cited

U.S. PATENT DOCUMENTS

| | | |
|---|---|---|
| 2010/0090714 A1 | 4/2010 | Van Geloven et al. |
| 2011/0055649 A1 | 3/2011 | Koushanfar et al. |
| 2011/0317829 A1* | 12/2011 | Ficke et al. ................. 380/46 |
| 2012/0033810 A1 | 2/2012 | Devadas et al. |
| 2012/0072476 A1* | 3/2012 | Bucci et al. .................. 708/270 |
| 2014/0035613 A1* | 2/2014 | Bucci et al. ..................... 326/8 |

FOREIGN PATENT DOCUMENTS

| | | |
|---|---|---|
| EP | 2230793 A2 | 9/2010 |
| WO | WO2008015603 A1 | 2/2008 |

OTHER PUBLICATIONS

Mansouri, S., et al. "Ring Oscillator Physical Unclonable Function With Multi Level Supply Voltages" CoRR. Jul. 2012. (7 Pages).
Suh, G., et al. "Physical Unclonable Functions for Device Authentication and Secret Key Generation" Proceedings of the 44th Design Automation Conference, DAC 2007. Jun. 2007. (6 Pages).

* cited by examiner

*Primary Examiner* — Daniel D Chang
(74) *Attorney, Agent, or Firm* — Tutunjian & Bitetto, P.C.; Anne V. Dougherty

(57) ABSTRACT

Methods, systems and devices related to authentication of chips using physical physical unclonable functions (PUFs) are disclosed. In preferred systems, differentials of PUFs are employed to minimize sensitivity to temperature variations as well as other factors that affect the reliability of PUF states. In particular, a PUF system can include PUF elements arranged in series and in parallel with respect to each other to facilitate the measurement of the differentials and generation of a resulting bit sequence for purposes of authenticating the chip. Other embodiments are directed to determining and filtering reliable and unreliable states that can be employed to authenticate a chip.

8 Claims, 8 Drawing Sheets

PHYSICAL UNCLONABLE FUNCTION GENERATION AND MANAGEMENT

BACKGROUND

1. Technical Field

The present invention relates to physical unclonable functions, and more particularly, to on-chip physical unclonable function generation and management thereof.

2. Description of the Related Art

Process variations of integrated circuits present a fundamental reliability challenge with regard to generation and measurement of physical unclonable functions. In particular, there is an inherent contradiction between forming a physical unclonable function (PUF) which depends on large variability and fabricating a reliable PUF measurement system which depends on low variability while integrating both functions monolithically on the same chip. For example, although process variability maximizes the effectiveness of a PUF, process variability degrades the performance of the measurement circuit. As such, a manufacturing design goal is to maximize process variability for the PUF ($\sigma_{PUF}$) circuit and minimize process variability for the measurement circuit. In addition, process, voltage supply, temperature, and aging variability results in measurement incertitude that forms an incertitude zone defined by a measurement standard deviation ($\sigma_{meas}$).

For example, diagram 100 of FIG. 1 illustrates an example of a voltage normal distribution due to process variability for a PUF and its binarization by a perfect measurement system. As illustrated in diagram 200 of FIG. 2, measurement error results in an incertitude zone 202 that stems from process variability. Although the measurement error cannot be reduced to zero, any PUF scheme should incorporate a measurement system that minimizes measurement variability. However, this is difficult to achieve when the PUF scheme is implemented on-chip due to the conflicting goals of maximizing process variability for PUF generation and minimizing process variability to manufacture a reliable integrated circuit.

SUMMARY

One embodiment is directed to a circuit authentication system including a plurality of PUF elements and a measurement unit. The PUF elements include a first subset of PUF elements that are arranged in series and a second subset of PUF elements that are arranged in series, where the first subset of PUF elements is arranged in parallel with respect to the second subset of PUF elements. In addition, the measurement unit is configured to measure at least one differential of states between the first subset of PUF elements and the second subset of PUF elements. Here, the one or more differentials of states form a basis of at least part of a bit sequence of an authentication signature for the circuit.

Another embodiment is directed to a method for authenticating a circuit. In accordance with the method, a test voltage is applied to a PUF system including a first subset of PUF elements that are arranged in series and a second subset of PUF elements that are arranged in series, where the first subset of PUF elements is arranged in parallel with respect to the second subset of PUF elements. In addition, the PUF system is measured to obtain at least one differential of states between the first subset of PUF elements and the second subset of PUF elements. Further, the method includes outputting an authentication sequence for the circuit that is based on the one or more differentials of states.

Another embodiment is directed to a method for identifying unreliable PUF states of a PUF system. In accordance with the method, a positive differential of states between a first element in a PUF system and a second element in the PUF system is generated. The method further includes generating a negative differential of the states between the first element and the second element in the PUF system. In addition, the states of the first and second elements are marked as unreliable states if the negative differential is different from the positive differential.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
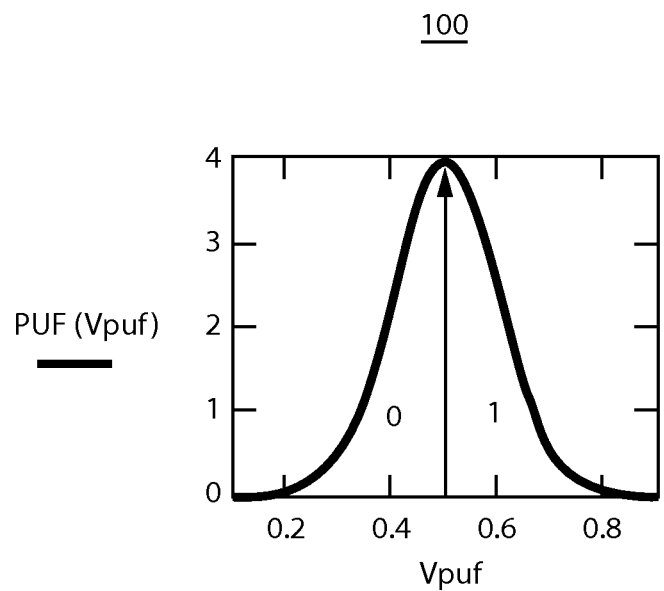
FIG. 1 is a graph illustrating an exemplary PUF probability distribution function.
Figure 2:
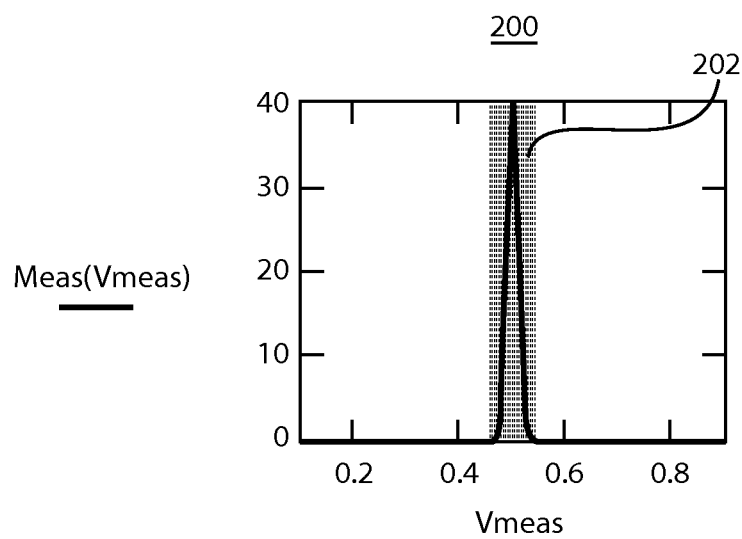
FIG. 2 is a graph illustrating a measurement incertitude for a PUF due to process variability.

As noted above, process variability leads to an inherent incertitude in measurement of PUF states. However, other factors also contribute to measurement error. For example, the temperature of circuit elements, noise, aging effects, radiation and supply voltage variations can lead to a drift in the PUF probability distribution function (PDF) and also to an expansion of the measurement error. For example, these additional factors can cause a drift of the PDF 102 in FIG. 1 to the right or left and can cause an expansion of the incertitude zone 202 in FIG. 2 to the right and/or to the left. Thus, these additional factors can decrease the effectiveness of on-chip PUF systems.

The exemplary embodiments described herein incorporate features that can mitigate the dependence of a PUF on temperature, noise, aging, radiation and/or supply voltage variations to provide a robust and reliable PUF scheme. For example, PUF variability can be reduced by employing a differential of PUF states, which has a reduced sensitivity to temperature, noise and variations. In particular, preferred embodiments employ a PUF design that arranges PUF devices in series and in parallel to provide a simple and effective means for obtaining the differential of PUF states. As discussed herein below, the element design can be implemented using a wide variety of devices, including field effect transistors (FETs) in a variety of configurations, resistors, wires in back end of line (BEOL) wires, wires in front end of line (FEOL) wires and vias.

As will be appreciated by one skilled in the art, aspects of the present invention may be embodied as a system, method, device or computer program product. Accordingly, aspects of the present invention may take the form of an entirely hardware embodiment, or an embodiment combining software (including firmware, resident software, micro-code, etc.) and hardware aspects that may all generally be referred to herein as a "module" or "system." Furthermore, certain aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and devices according to embodiments of the invention. It will be understood that certain blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and devices according to various embodiments of the present invention. In this regard, certain blocks in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer software instructions.

A design for an integrated circuit chip in accordance with embodiments of the present invention may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 3:
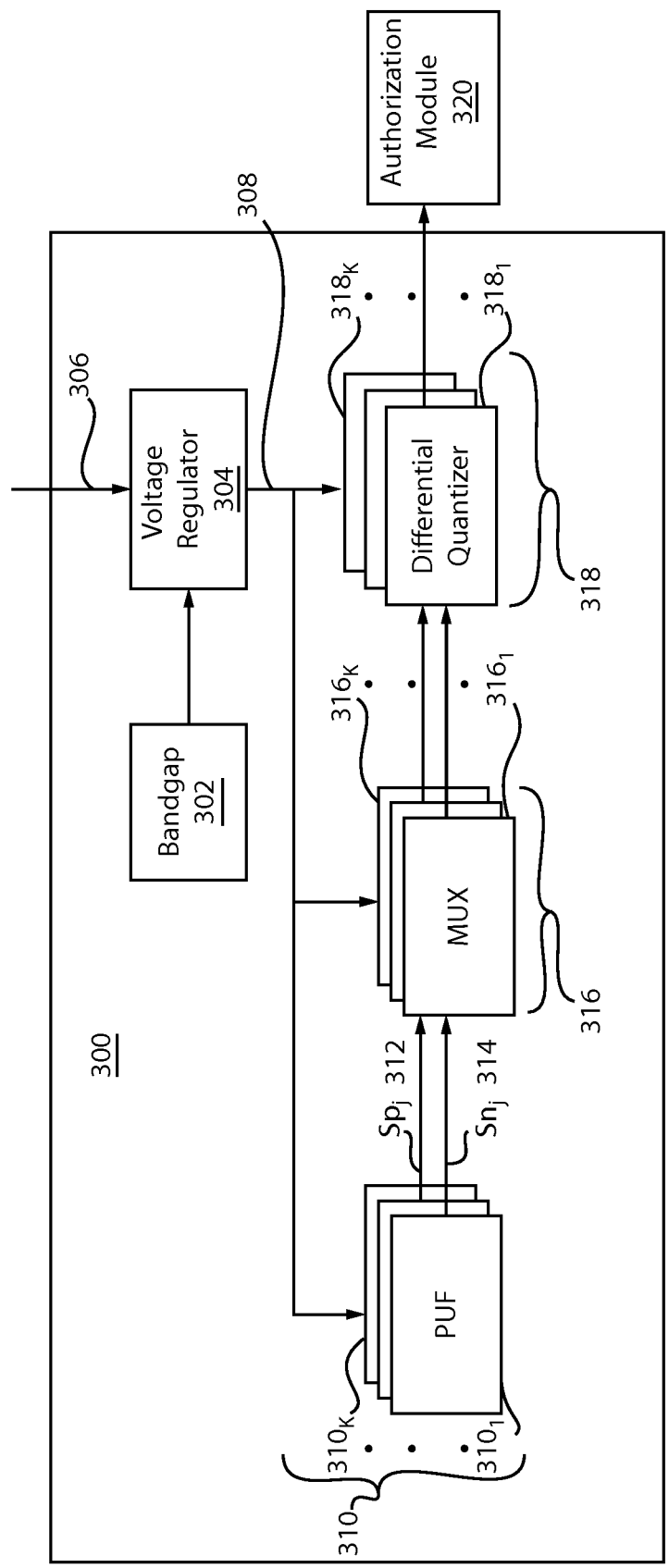
FIG. 3 is a high-level block/flow diagram of an exemplary system/method for generating PUF information in accordance with an exemplary embodiment of the present invention.

Referring again to the drawings in which like numerals represent the same or similar elements, FIG. 3 illustrates an exemplary system/method 300 for generating PUF information. It should be noted that each of the elements of the system 300 may be implemented on-chip as hardware processors or elements. In accordance with one exemplary aspect, supply voltage variability affecting PUF measurement can be reduced by employing a bandgap voltage generator 302 that generates a reference voltage which is independent of the supply voltage for the integrated circuit and of the temperature. Further, the voltage regulator 304 regulates the noisy on-chip power supply $V_{DD}$ 306 to provide a stable regulated voltage (VREG) 308 to one or more PUF units $310_1$-$310_k$, one or more multiplexer (MUX) units $316_1$-$316_k$ and one or more differential quantizers $318_1$-$318_k$. The PUF units $310_1$-$310_k$, collectively referred to as PUF unit 310, can be composed of transistors, resistors, wires, etc., as noted above. Further, states $Sp_j$ 312 and $Sn_j$ 314 can be measured from the PUF unit 310 to obtain a PUF differential Sp-Sn. The difference Sp-Sn has a reduced sensitivity to temperature, noise and supply variations, and, as discussed in further detail herein below, can be employed to generate a PUF identifier or signature for the integrated circuit or chip. Further, one or more multiplexers $316_1$-$316_k$, collectively referred to as multiplexer 316, are configured to obtain $Sp_j$ and $Sn_j$ states from the PUF unit 310 and to combine a total number of $Sp_j$ and $Sn_j$ states and generate a larger total number of differential states than the total number of PUF elements in the PUF unit 310. In addition, one or more or more differential quantizers $318_1$-$318_k$, collectively referred to as quantizer 318, can be configured to measure the difference Sp and Sn and determine whether the difference is a logic "0" or "1." Thus, the quantizer 318 can assess whether each of the differentials of states is a one or a zero to form a bit sequence that denotes the differentials. The quantizer can thereby output the chip unique k-bit sequence, which is a unique PUF identifier or authentication signature for the chip or integrated circuit, to an authentication module 320, which can employ an authentication database to authenticate the chip. In accordance with one exemplary aspect, the multiplexer 316 can be configured to multiplex the differentials $Sp_j$-$Sn_j$ to the quantizer 318 such that any one or more of the quantizers $318_1$-$318_k$ are reused for measurements of several PUF units to conserve chip area employed for the measurement circuitry.

Figures 4, 5, 6:
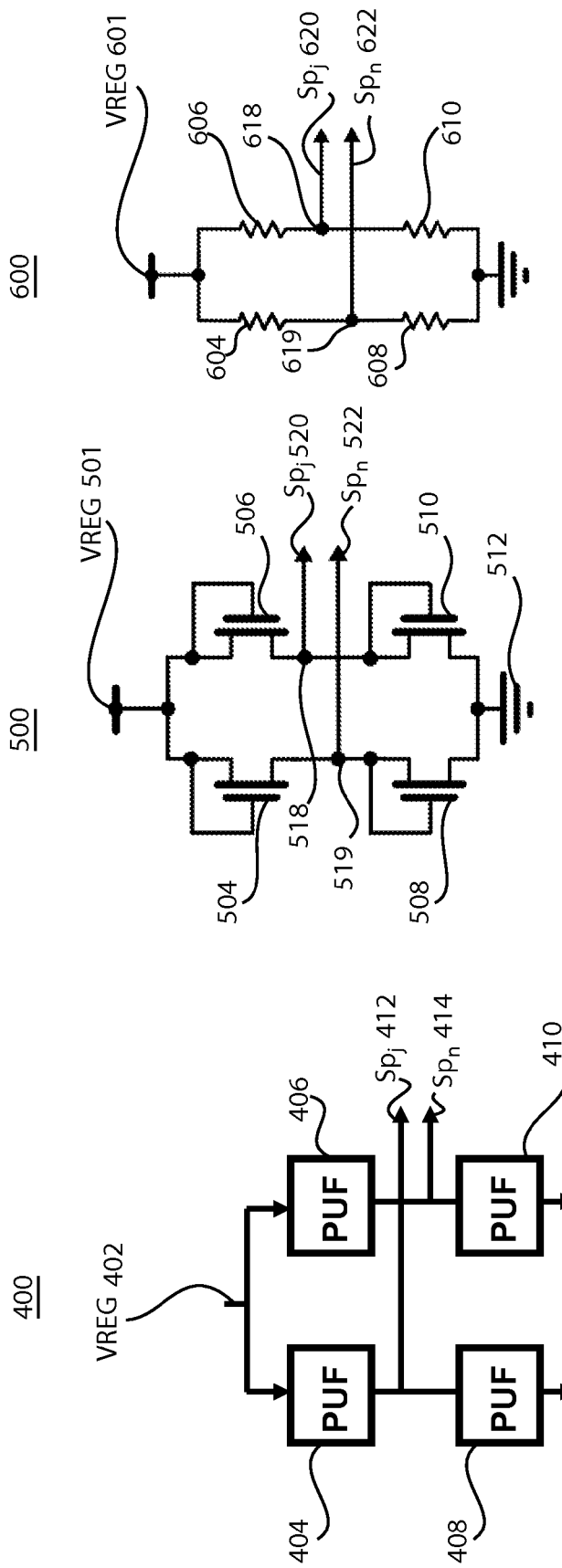
FIG. 4 is a high-level block/flow diagram of an exemplary PUF system in accordance with an exemplary embodiment of the present invention.
FIG. 5 is a high-level block diagram of an exemplary PUF system that employs transistors in a diode configuration in accordance with an exemplary embodiment of the present invention.
FIG. 6 is a high-level block diagram of an exemplary PUF system that employs resistors as PUF elements in accordance with an exemplary embodiment of the present invention.

Referring now to FIG. 4, with continuing reference to FIG. 3, an exemplary design of a PUF system 400 in accordance with exemplary embodiments is illustratively depicted. The PUF system 400 can be implemented as the PUF unit 310 of FIG. 3. Here, a differential PUF is generated using voltage division. For example, a regulated voltage, VREG 402, can be applied to the system 400 as illustrated in FIG. 4. In one embodiment, the VREG 402 can be implemented by the VREG 308, discussed above with regard to FIG. 3. In the PUF system 400, the PUF units 404 and 406 are arranged in parallel, while the PUF units 408 and 410 are arranged in parallel as well. In addition, the PUF units 404 and 408 are arranged in series, while the PUF units 406 and 410 are also arranged in series. Thus, in this example, PUFs 404 and 406 form a subset of PUF elements that are arranged in series while PUFs 408 and 410 form a second subset of PUF elements that are arranged in series. Further, as illustrated in FIG. 4, the first subset of PUF elements is arranged in parallel with respect to the second subset of PUF elements. For example, FIG. 5 illustrates a PUF system 500, which is an exemplary embodiment of the PUF system 400, that employs transistors 504, 506, 508 and 510 as PUF units 404, 406, 408 and 410, respectively. Here, the transistors 504-510 are field-effect transistors that are in a diode configuration and are connected to a ground 512. Diodes can also be used in the system 500. A regulated voltage VREG 501 can be applied and the arrangement can be tapped at portions 518 and 519 to obtain states $Sp_j$ 520 and $Sn_j$ 522, as illustrated in FIG. 5.

As indicated above, the design of system 400 provides a simple and effective means for obtaining and utilizing the differential of PUF states. For example, PUF temperature variability is reduced by using a differential PUF circuit that generates the states Sp 412 and Sn 414, of which voltage states $Sp_j$ 520 and $Sn_j$ 522 are respective examples. Here, the measurement of the differential of states Sp 412 and Sn 414 corresponds to a differential of states between the first subset of PUF elements 404/406 and the second subset of PUF elements 408/410. As noted above, the difference Sp-Sn has a reduced sensitivity to temperature variations. Another benefit of the differential signals is the elimination of common-mode noise dependence, such as thermal or substrate noise, as well as supply variation dependence. Further, the PUF state need not be inferred from supply current measurements.

As discussed above, the system 400 of FIG. 4 can be implemented with a variety of devices. FIG. 6 illustrates another exemplary implementation of the PUF system 400. For example, FIG. 6 illustrates a PUF system 600 that employs resistors 604, 606, 608 and 610 as PUF units 404, 406, 408 and 410, respectively. A regulated voltage VREG 601 can be applied and the arrangement can be tapped at portions 618 and 619 to obtain states $Sp_j$ 620 and $Sn_j$ 622, as illustrated in FIG. 6, which are examples of states Sp 412 and Sn 414. The PUF system 400 can alternatively be implemented with BEOL wires, FEOL wires and vias, among other elements.

Figure 7:
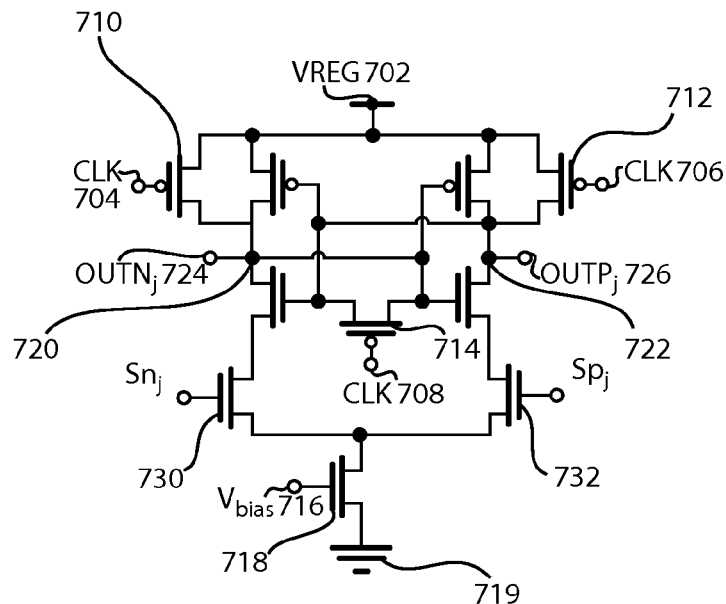
FIG. 7 is a high-level block diagram of an exemplary PUF system that employs a strongarm latch configuration in accordance with an exemplary embodiment of the present invention.
Figure 8:
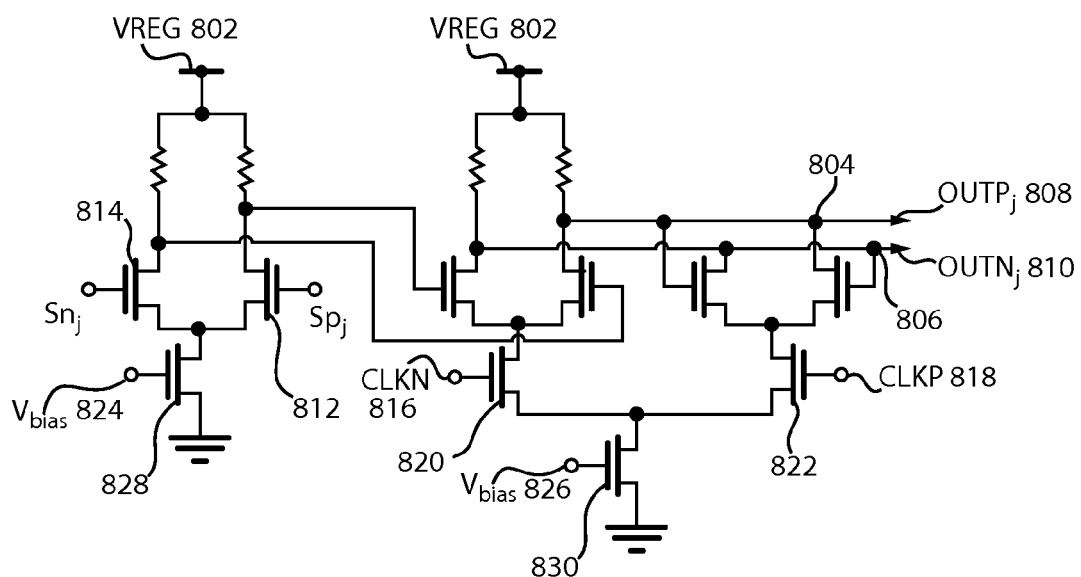
FIG. 8 is a high-level block diagram of an exemplary PUF system that employs a differential pair and current mode logic latch configuration in accordance with an exemplary embodiment of the present invention.

FIGS. 7 and 8 illustrate other examples of the PUF system 400. For example, FIG. 7 illustrates a strongarm latch configuration 700, while FIG. 8 illustrates a differential pair and current mode logic latch 800. As shown in FIG. 7, a regulated voltage, VREG 702, which is an implementation of VREG 308, can be applied to the system 700, while clock signals CLK 704, CLK 706 and CLK 708 can be applied to FETs 710, 712 and 714, respectively. In addition, a voltage bias 716 is applied to transistor 718, which is coupled to ground 719, as illustrated in FIG. 7. Here, the circuit is tapped at portions 720 and 722 to obtain outputs $OUTN_j$ 724 and $OUTP_j$ 726, respectively, as shown in FIG. 7. The differential $OUTP_j$-$OUTN_j$ models the differential $Sp_j$-$Sn_j$ between transistors 732 and 730 at the latching time, i.e. at the rising edge of the clock signal CLK.

In the differential pair and current mode logic latch 800, a regulated voltage, VREG 802, is applied, as shown in FIG. 8. VREG 802 is also an implementation of VREG 308. As shown in FIG. 8, the latch 800 can be tapped at portions 804 and 806 to obtain outputs $OUTP_j$ 808 and $OUTN_j$ 810, respectively. Similar to the latch of FIG. 7, the differential $OUTP_j$-$OUTN_j$ models the differential $Sp_j$-$Sn_j$ between transistors 812 and 814 at the rising edge of the differential clock signal CLKP-CLKN. As illustrated in FIG. 8, clock signals CLKN 816 and CLKP 818 are applied to transistors 820 and 822, respectively. In addition, voltage biases 824 and 826 are applied to transistors 828 and 830, respectively, which are connected to ground as illustrated in FIG. 8.

Figure 9:
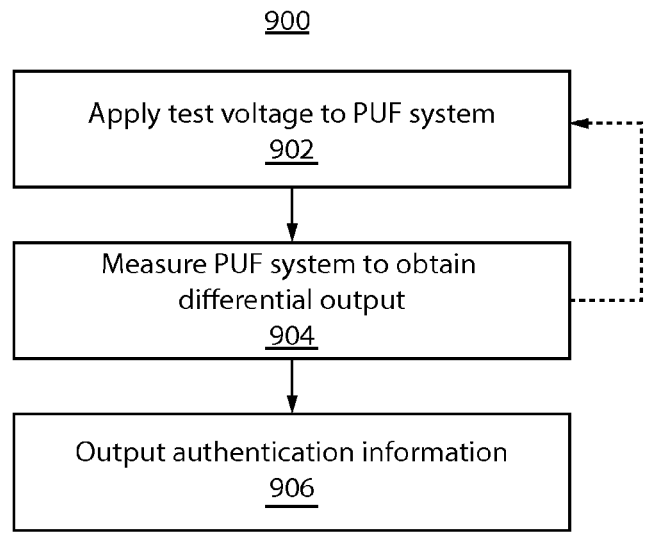
FIG. 9 is a high-level flow diagram of an exemplary method for providing authentication information from a PUF system for an integrated circuit in accordance with an embodiment of the present invention.

Referring now to FIG. 9, with continuing reference to FIGS. 3-8, a method 900 for providing authentication information from a PUF system for an integrated circuit in accordance with an embodiment of the present invention is illustratively depicted. The method can begin at step 902, at which the voltage regulator 304 can apply a test voltage to the PUF system. For example, the voltage regulator 304 can apply the regulated voltage VREG 402, 501, 601, 702 and 802 to systems 400, 500, 600, 700 and 800, respectively, as discussed above.

At step 904, the differential quantizer 318 can measure the PUF system to obtain a differential of states $Sp_j$ 312-$Sn_j$ 314. For example, the differential quantizer 318 can measure the differential output of the PUF system 310 through the multiplexer 316, as discussed above. In accordance with various embodiments of the present invention, the differential quantizer 318 can measure the differential $Sp_j$ 520-$Sn_j$ 522 of the system 500, $Sp_j$ 620-$Sn_j$ 622 of the system 600, $OUTP_j$ 726-$OUTN_j$ 724 of the system 700 and/or $OUTP_j$ 808-$OUTN_j$ 810 of the system 800. Further, the quantizer 318 can compile the one or more differentials to obtain a bit sequence that is an authentication signature and identifies the integrated circuit or chip. Another advantage of using a differential PUF and differential quantizer, is that it is not possible to infer the state of the PUF by measuring its current consumption, since the current consumption is the same for a measured 0 or a 1.

At step 906, the differential quantizer 318 can output authentication information for the circuit. For example, the bit sequence obtained by the quantizer 318 can be output to the external authentication module 320, which can then compare the bit sequence to a value stored in an authentication database to authenticate the circuit. If the sequence matches a corresponding value stored in the database, then the circuit is authenticated. Otherwise, the authentication fails. A more sophisticated embodiment of the authentication scheme is discussed in more detail herein below with respect to FIG. 13.

Figure 10:
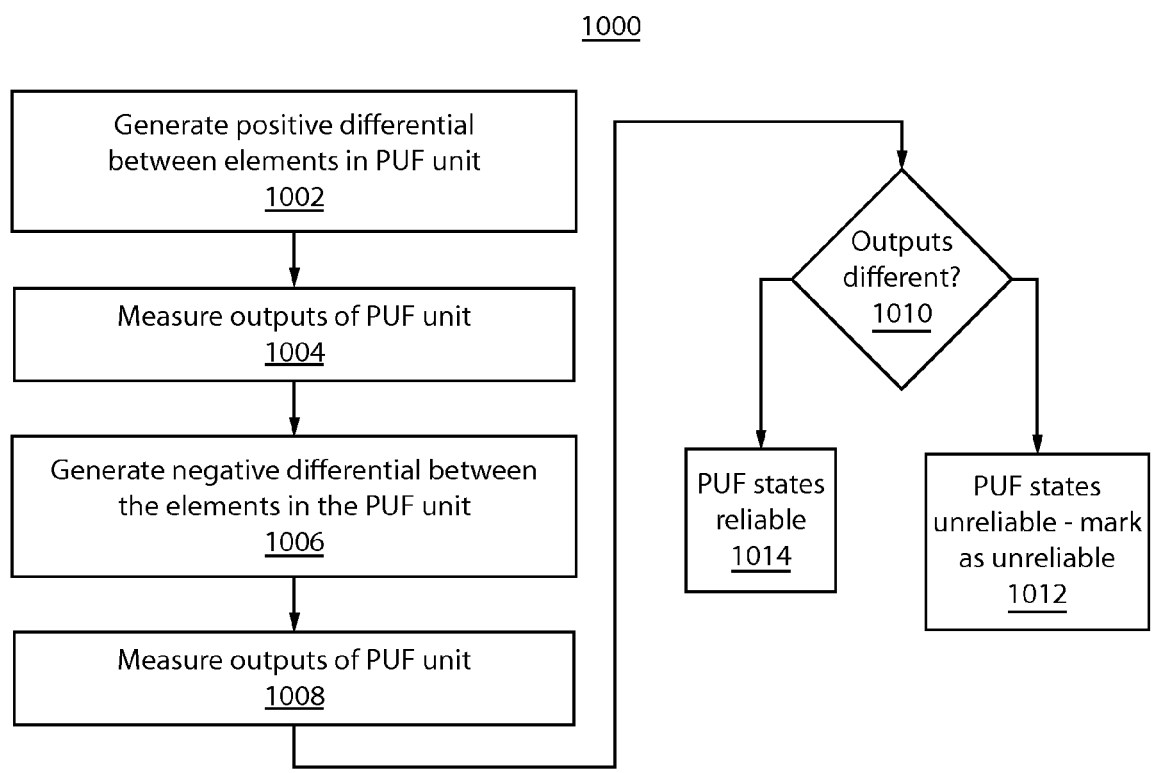
FIG. 10 is a high-level flow diagram of an exemplary method for filtering PUF states in accordance with an exemplary embodiment of the present invention.
Figure 11:
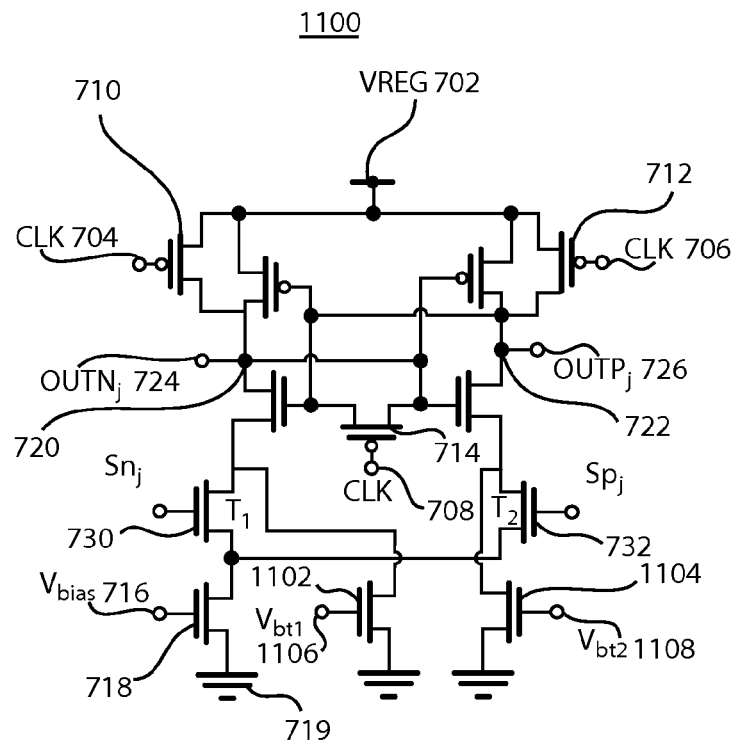
FIG. 11 is a high-level block diagram of an alternative exemplary PUF system that employs a strongarm latch configuration in accordance with an exemplary embodiment of the present invention.
Figure 12:
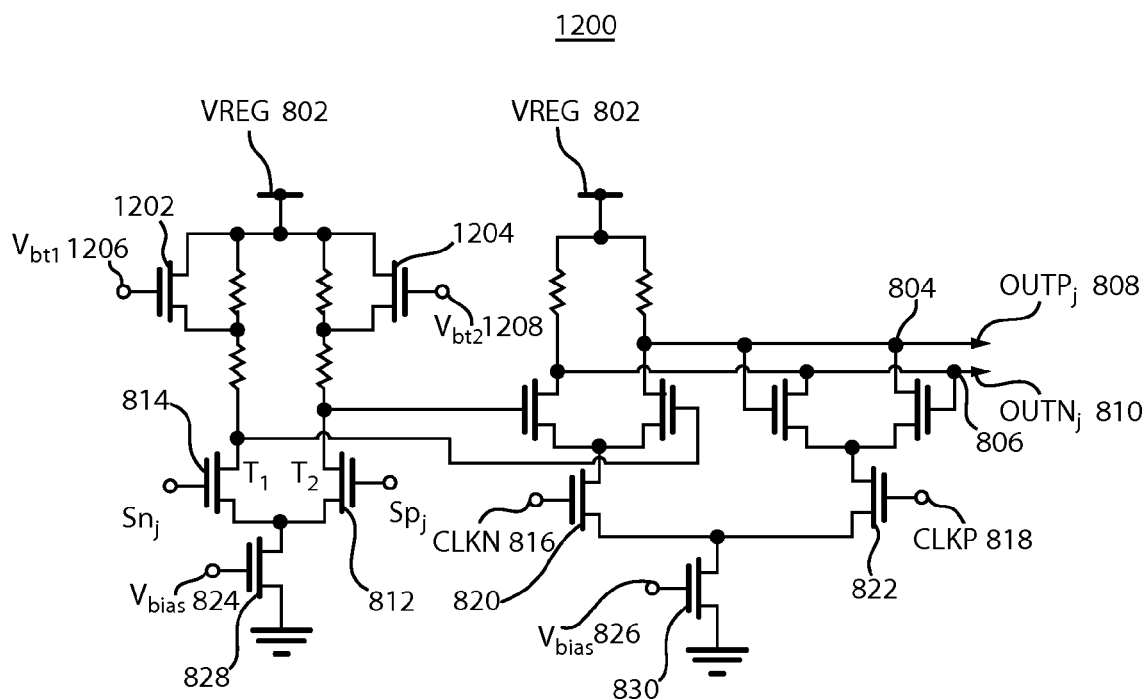
FIG. 12 is a high-level block diagram of an alternative exemplary PUF system that employs a differential pair and current mode logic latch configuration in accordance with an exemplary embodiment of the present invention.

Referring now to FIG. 10, a method 1000 for filtering PUF states in accordance with an exemplary embodiment of the present invention is depicted. In particular, the method 1000 can be employed to detect unstable PUF elements and guarantee an arbitrary low measurement error rate. In preferred embodiments of the present invention, the unstable PUF elements are also used to generate a signature or unique bit sequence that can be also be used to authenticate an integrated circuit. Indeed, the location of the unstable PUFs is unique for each manufactured chip, and therefore is useful information for identifying the chip. For illustrative purposes, reference is also made to FIGS. 11 and 12, which respectively show slightly modified versions of the systems 700 and 800 of FIGS. 7 and 8. For example, FIG. 11 illustrates a system 1100 which is essentially system 700 with transistors 1102 and 1104 added so that test voltages $V_{bt1}$ 1106 and $V_{bt2}$ 1108 can be applied thereto for purposes of generating a differential $Sp_j$-$Sn_j$ between transistors T2 732 and T1 730 that is measurable through outputs $OUTP_j$ 726-$OUTN_j$ 724. As illustrated in FIG. 11, the drains of transistors 1102 and 1104 are coupled to the drains of transistors 730 and 732, respectively. Similarly, FIG. 12 illustrates a system 1200 which is essentially system 800 with transistors 1202 and 1204 added so that test voltages $V_{bt1}$ 1206 and $V_{bt2}$ 1208 can be applied thereto for purposes of generating a differential $Sp_j$-$Sn_j$ between transistors T2 812 and T1 814 that is measurable through outputs $OUTP_j$ 808-$OUTN_j$ 810. As illustrated in FIG. 12, the sources of transistors 1202 and 1204 are coupled to the drains of transistors 814 and 812, respectively.

Figure 13:
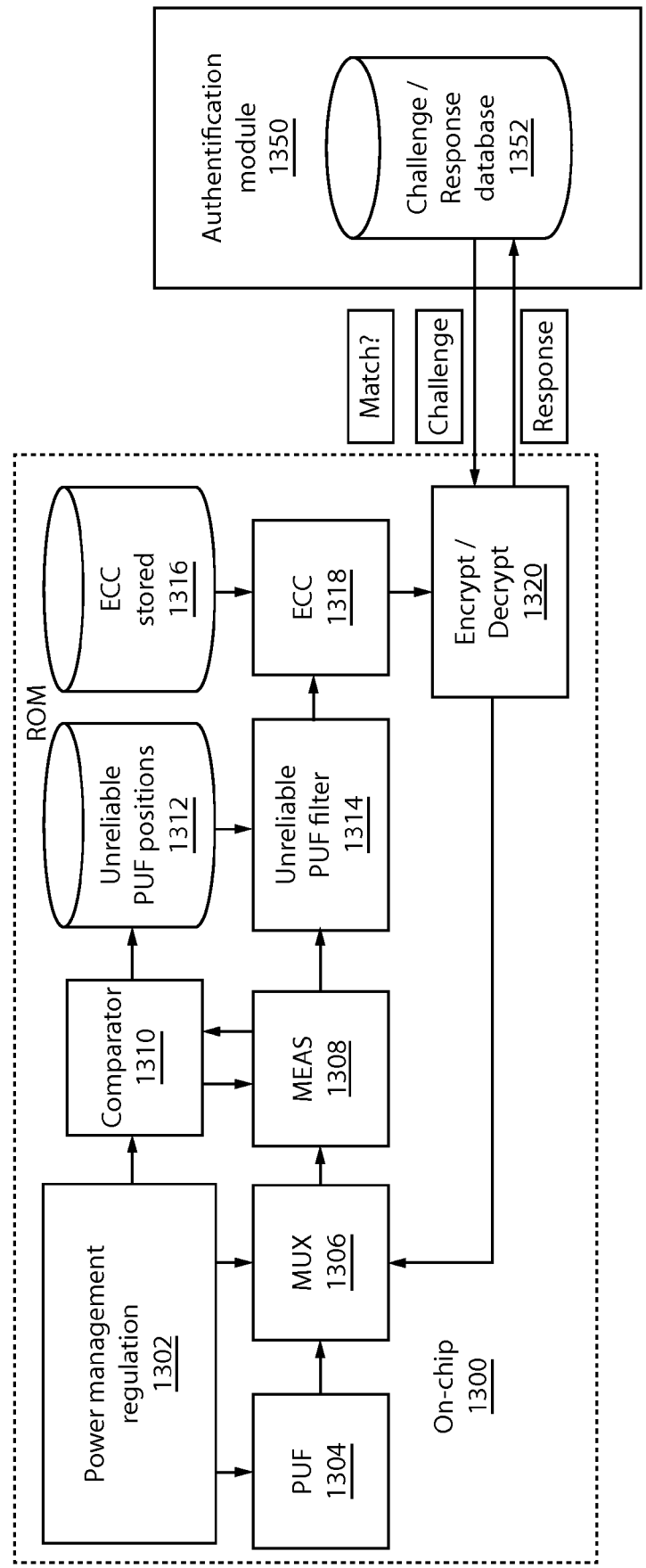
FIG. 13 is a high-level block/flow diagram of another exemplary system/method for generating PUF information and authenticating a chip in accordance with an exemplary embodiment of the present invention.

In accordance with one exemplary implementation, the method 1000 can be performed by an authentication system 1300, illustrated in FIG. 13, which is a more sophisticated implementation of the authentication system 300 of FIG. 3. For example, the power management regulation unit 1302 is one implementation of the voltage regulator 304 and the bandgap voltage generator 302, the PUF unit 1304 is an implementation of the PUF unit 310, the MUX unit 1306 is an implementation of the MUX unit 316. Further, the differential quantizer unit 318 is an example of the measurement unit 1308. Here, the method 1000 can be performed by setting the system 1300 to a filtering mode. The filtering mode can be set during, for example, manufacture of the chip or integrated circuit on which the PUF system is implemented. As discussed above with respect to FIG. 3, each of the elements of the system 1300 may be implemented on-chip as hardware processors or elements.

The method 1000 can begin at step 1002, at which the power management unit 1302 can generate a positive differential of states between elements in a PUF system. For example, referring again to FIGS. 11 and 12, during normal operation, the voltage $V_{bt1}$ 1106 and $V_{bt2}$ 1108, and also $V_{bt1}$ 1206 and $V_{bt2}$ 1208, are in the off-state, i.e. $V_{bt1}=V_{bt2}=0$. Here, in the filtering mode, at step 1002, the power management unit 1302 can set $V_{bt1}$ 1106=0, or $V_{bt1}$ 1206=0, and can set $V_{bt2}$ 1108=1, or $V_{bt2}$ 1208=1. By setting $V_{bt1}$ 1106, or $V_{bt1}$ 1206, to an "off" or deactivated state and setting $V_{bt2}$ 1108, or $V_{bt2}$ 1208, to an "on" or activated state in this way, an added positive differential voltage is created between the drains of transistors T1 730 and T2 732, or transistors T1 814 and T2 812.

At step 1004, the measurement unit 1308 can measure the outputs of the PUF unit. For example, in the examples illustrated in FIGS. 11 and 12, the positive differential voltage between the drains of transistors T1 730 and T2 732 can be measured at outputs $OUTN_j$ 724 and $OUTP_j$ 726, or the positive differential voltage between the drains transistors T1 814 and T2 812 can be measured at outputs $OUTN_j$ 810 and $OUTP_j$ 808.

At step 1006, the power management unit 1302 can generate a negative differential of states between elements in a PUF system. For example, the power management unit 1302 can set $V_{bt1}$ 1106=1, or $V_{bt1}$ 1206=1, and can set $V_{bt2}$ 1108=0, or $V_{bt2}$ 1208=0. By setting $V_{bt1}$ 1106, or $V_{bt1}$ 1206, to an "on" or activated state and setting $V_{bt2}$ 1108, or $V_{bt2}$ 1208, to an "off" or deactivated state in this way, an added negative differential voltage is created between the drains of transistors T1 730 and T2 732, or transistors T1 814 and T2 812.

At step 1008, the measurement unit 1308 can measure the outputs of the PUF unit. For example, in the example illustrated in FIGS. 11 and 12, the added negative differential between the drains of transistors T1 730 and T2 732 can be measured at outputs $OUTN_j$ 724 and $OUTP_j$ 726, or the added negative differential between the drains of transistors T1 814 and T2 812 can be measured at outputs $OUTN_j$ 810 and $OUTP_j$ 808.

At step 1010, the comparator 1310 can determine whether the differential of the outputs measured at step 1004 and the differential of the outputs measured at step 1008 are different. If the differentials are the same, then the comparator 1310 deems the PUF states for the PUF unit being evaluated in the current iteration of the method 1000 to be reliable at step 1014. Thereafter, the method 1000 can be repeated for another PUF unit or combination of PUF units. If the differentials are different, then the comparator 1310 deems the PUF states for the PUF unit being evaluated in the current iteration of the method 1000 to be unreliable and are marked as unreliable at step 1012. Thereafter, the method 1000 can be repeated for another PUF unit or combination of PUF units.

To mark the PUF chip positions of the respective unreliable PUF unit or combination of PUF units, the comparator 1310 can store the chip positions or addresses in a Read Only Memory (ROM) unit, such as efuse, for example, including a database 1312 of unreliable PUF positions. As discussed herein below, during authentication, the unreliable PUF units can be filtered and/or even utilized for authentication purposes. It should be noted that, by increasing the filter width, it is possible to improve the PUF system error rate at the expense of a reduced number of stable PUF states. Indeed increasing the filter width is equivalent to removing PUF states further away to the measurement system threshold. Therefore, by increasing the filter width it becomes easier for the measurements system to distinguish the different states.

Figure 14:
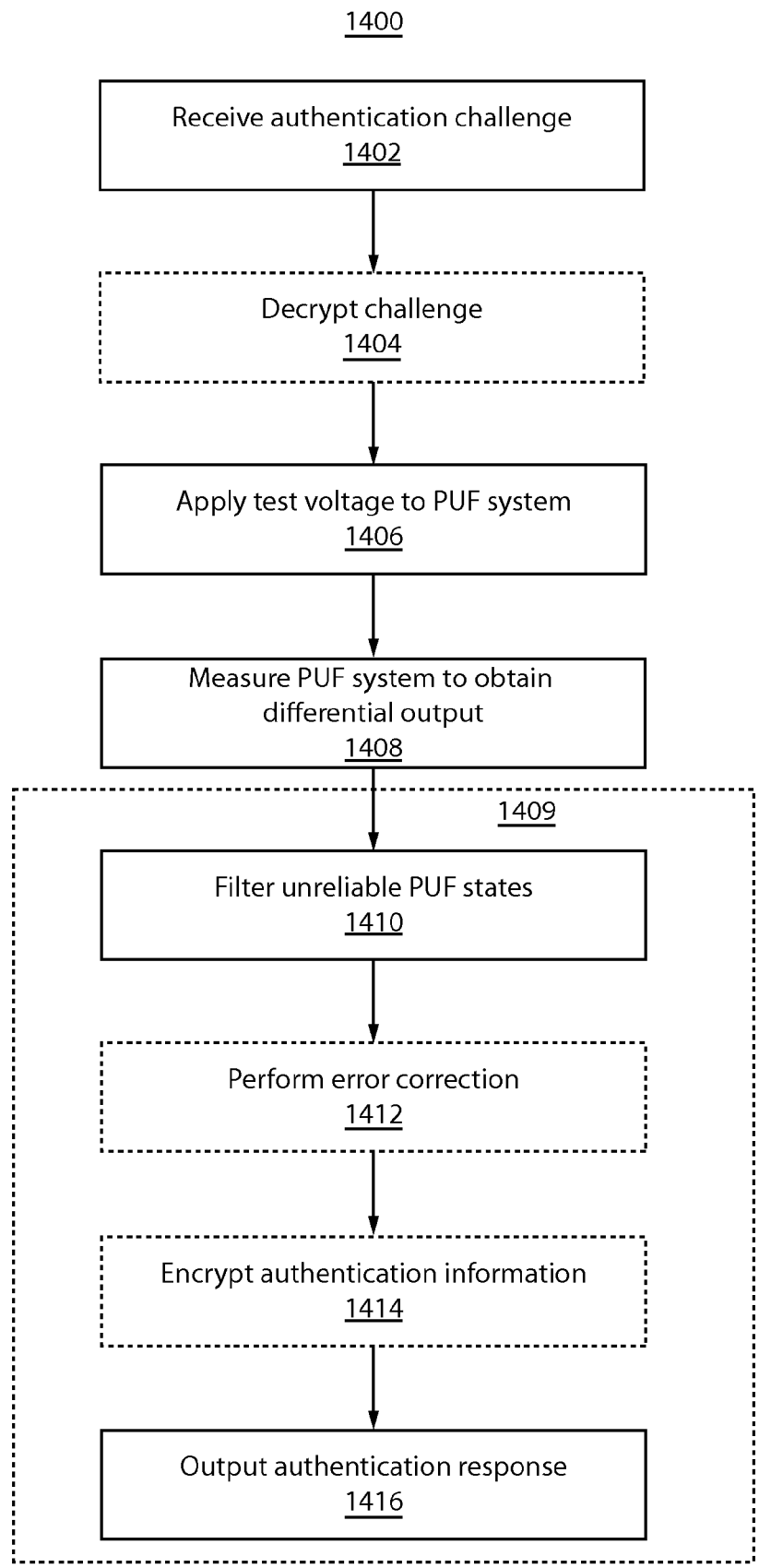
FIG. 14 is a high-level flow diagram of an exemplary method for authenticating a chip or an integrated circuit including a PUF system in accordance with an exemplary embodiment of the present invention.

Referring now to FIG. 14, with continuing reference to FIGS. 3, 9 and 13, an exemplary method 1400 for authenticating a chip or an integrated circuit, in which a PUF system embodiment according to the present invention is implemented, is illustratively depicted. The method 1400 can begin at step 1402, at which the authentication system 1300 can receive an authentication challenge. For example, in accordance with one embodiment, an external authentication module 1350, which is a more sophisticated implementation of the authentication module 320, can reference a challenge/response database 1352, stored in a storage medium, to issue a challenge to the authentication system 1300 to authenticate a chip or integrated circuit to which the authentication system is attached. Here, the chip authentication method can be used, for example, for supply-chain quality control. Further, encryption can be used to prevent unauthorized access to PUF states by performing an exhaustive search. Thus, the authentication module 1350 can be configured to encrypt the challenge, which can be a bit sequence, and to send the encrypted challenge to the authentication system 1300. When the authentication system 1300 receives the challenge, the power management module 1302 can turn on or activate the system 1300.

Optionally, if the challenge received at step 1402 is encrypted, at step 1404, the encryption/decryption module 1320 can decrypt the challenge.

At step 1406, the power management module 1302 can apply a test voltage to the PUF system or unit 1304. For example, the test voltage can be applied to the PUF system or unit 1304 as discussed above with respect to step 902 of the method 900.

At step 1408, the measurement unit 1308 can measure the PUF system to obtain one or more differentials and to generate a bit sequence as a signature for the integrated circuit or chip. For example, the measurement unit 1308 can measure differentials of the PUF system or unit 1304 and obtain the sequence or signature as discussed above with respect to step 904 of the method 900. However, here, in this embodiment, the multiplexer 1306 can be configured to combine or multiplex the challenge bit sequence with the outputs of the PUF system 1304 for purposes of generating a response. Thus, the measurement module can determine the differentials as discussed above with respect to step 904 and can modify or combine the measured differentials in a pre-determined manner with the bits of the challenge.

The method may proceed to block 1409, which is an exemplary implementation of step 906. At step 1410, the filter module 1314 can filter unreliable PUF states. For example, the filter module 1314 can reference the database 1312 of unreliable PUF positions to determine and identify which of the PUF states received from the measurement module 1308 are unreliable. In addition, the filter module 1314 can fill or replace such unreliable PUF states with predetermined bit sequences of zeros and ones. Further, it should be noted that, in certain exemplary embodiments, the unreliable PUF states can be checked for instability and thus be an added layer of copy protection. The unreliable states are indeed also part of the chip "DNA" and therefore this information is also valuable and can be used to prevent the copy of the chip PUF. In the preferred embodiment, the chip PUF is composed of two parts, the set of reliable PUF states and the set of unreliable PUF states, which are both used to identify the chip.

Optionally, at step 1412, an optional error code correction (ECC) module 1318 can perform error correction on the PUF states received from the filter 1314 and output the resulting authentication information. For example, error code correction can be performed based on error correction bits stored in a database 1316 in ROM to further reduce the error rate.

Optionally, at step 1414, the encryption/decryption module 1320 can encrypt the authentication information received, for example, from the optional ECC module 1318 to generate an authentication response.

At step 1416, the authentication response, which can be an authentication signature or sequence, can be output by the system 1300 to the authentication module 1350. It should be noted that, in certain exemplary implementations, the authentication response can be the error-corrected sequence of differentials of PUF states provided by the ECC module 318, the filtered sequence of differentials of PUF states provided by the filter 1314 or the sequence of differentials of PUF states provided by the measurement unit 1308. For each of these scenarios, in accordance with certain exemplary embodiments, the authentication response or sequence need not be the explicit differentials of states, but can be the result of predetermined modifications of the differentials of states by, for example, combining the differentials with the authentication challenge in a pre-determined manner.

After the authentication response is output by the system 1300, the power management unit 1302 can deactivate the system 1300 by turning off the power supply. After receiving the authentication response, the authentication module 1350 can compare the response to a master challenge/response database 1352. If the authentication response matches the corresponding response listed on the database 1352 for the challenge sent to the system 1300, then the chip or integrated circuit is authenticated. Optionally, if a mismatch is detected, then a new challenge can be sent and the method 1400 can be repeated, as occasionally, an error may occur.

Having described preferred embodiments of systems, devices and methods for PUF generation and management (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A circuit authentication system comprising:
a plurality of physical unclonable function (PUF) elements including a first subset of PUF elements that are arranged in series and a second subset of PUF elements that are arranged in series, wherein the first subset of PUF elements is arranged in parallel with respect to the second subset of PUF elements;
a measurement unit configured to measure at least one differential of states between said first subset of PUF elements and said second subset of PUF elements at respective intermediate connection points between two serially connected PUF elements in the first subset and between two serially connected PUF elements in the second subset, said at least one differential of states forming a basis of at least part of a bit sequence of an authentication signature for said circuit; and
a filter configured to filter unreliable states determined by the measurement unit by replacing said unreliable states with predetermined bits,
wherein the first subset and the second subset exclude current mirrors.

2. The circuit authentication system of claim 1, wherein said plurality of PUF elements include at least one of transistors, diodes or resistors.

3. The circuit authentication system of claim 1, wherein said plurality of PUF elements include transistors arranged in a diode configuration.

4. The circuit authentication system of claim 1, wherein said measurement unit comprises at least one quantizer configured to assess whether each of the differentials of states is a one or a zero in said bit sequence.

5. The circuit authentication system of claim 1, further comprising a multiplexer configured to combine said states to generate a total number of said differentials of states that is larger than a total number of PUF elements in said plurality of PUF elements.

6. The circuit authentication system of claim 1, further comprising a plurality of additional PUF elements configured to have an additional differential voltage applied thereto, wherein the measurement unit is configured to determine the filtered unreliable states by employing measurements of said additional PUF elements obtained with said additional differential voltage applied thereto.

7. The circuit authentication system of claim 1, wherein the plurality of PUF elements consist of resistors.

8. The circuit authentication system of claim 1, further comprising a multiplexer configured to combine said states, wherein said measurement unit comprises at least one quantizer configured to assess whether each of the differentials of states is a one or a zero in said bit sequence, and wherein the multiplexer, the at least one quantizer, and at least some of the PUF elements are each connected to a same regulated voltage.

* * * * *